United States Patent [19]

Kondo

[11] Patent Number: 5,039,864

[45] Date of Patent: Aug. 13, 1991

[54] DEVICE FOR REPLACING ELECTRON MICROSCOPE SPECIMENS

[75] Inventor: Yukihito Kondo, Tokyo, Japan

[73] Assignee: Jeol Ltd., Tokyo, Japan

[21] Appl. No.: 561,876

[22] Filed: Aug. 2, 1990

[30] Foreign Application Priority Data

Aug. 11, 1989 [JP] Japan .................................. 1-208187

[51] Int. Cl.⁵ ............................................ H01J 37/20
[52] U.S. Cl. ............................. 250/442.1; 250/441.1; 250/443.1; 250/440.1
[58] Field of Search ............... 250/442.1, 441.1, 443.1, 250/440.1

[56] References Cited

U.S. PATENT DOCUMENTS 2,220,973  11/1940  Marton ............................. 250/441.1
3,761,709   9/1973  Hasegawa et al. ................. 250/441.1

OTHER PUBLICATIONS

Japanese Utility Model Laid-Open No. 62662/1984.

Primary Examiner—Jack I. Berman
Attorney, Agent, or Firm—Webb, Burden, Ziesenheim & Webb

[57] ABSTRACT

A device for replacing an electron microscope specimen. The device moves a specimen holder from inside the atmosphere onto a specimen stage via a preliminary chamber, the stage being installed in the specimen chamber of the microscope. The device comprises a valve partitioning the preliminary chamber from the specimen chamber, a movable cylinder capable of being moved through the preliminary chamber into the specimen chamber, a hermetic seal, and a lead wire connecting the specimen holder with a terminal. The cylinder has a cover at its front end. The terminal extends through the cover and is insulated from it. A specimen insertion rod is held by a mechanism mounted in the cover. When the cylinder is inserted close to the partition valve, the hermetic seal maintains the specimen chamber airtight.

12 Claims, 4 Drawing Sheets

DEVICE FOR REPLACING ELECTRON MICROSCOPE SPECIMENS

FIELD OF THE INVENTION

The present invention relates to improvements in a device for replacing electron microscope specimens.

BACKGROUND OF THE INVENTION

In transmission electron microscopy, a new specimen is cooled and then observed after the previous specimen is replaced by this new specimen or after it is treated in a vacuum. For example, where a clean surface of a specimen is observed after it is treated in a high vacuum, a device as described in Japanese Utility Model Laid-Open No. 62662/1984 has been used. This device is illustrated in FIG. 5, where the electron microscope incorporating this device includes a specimen chamber having a side wall 1. Also shown are a partition valve 2, a preliminary evacuation chamber a specimen insertion rod 4 acting also as a specimen stage, and a specimen holder 5. When the specimen holder 5 is detachably held at the front end of the specimen insertion rod 4, the holder 5 can be moved from inside the atmosphere into the specimen chamber or vice versa via the evacuation chamber 3, for replacing the holder 5 with a new one. The inside of the evacuation chamber 3 is evacuated through an evacuation tube 6. The side surface of the specimen insertion rod 4 is provided with an annular groove in which an 0 ring 7 is fitted. This 0 ring is in contact with the inner wall surface of a specimen insertion port 8 formed in the evacuation chamber 3 to maintain the airtightness.

When the specimen is observed using the device described above, the specimen holder 5 set up within the atmosphere is first attached to the front end of the specimen insertion rod 4. The front end portion of the rod 4 is inserted into the specimen chamber through the specimen insertion port 8. Then, the inside of the preliminary evacuation chamber 3 is evacuated by a vacuum pump (not shown) via the evacuation tube 6. The side wall of the chamber 3 is provided with an opening 9 to permit insertion of an attachment. A cover lo is placed over the opening 9 This cover 10 is removed, and any one of various specimen treating apparatuses is inserted into the chamber. Thus, the specimen can be treated variously while maintaining the vacuum. Then, the partition valve 2 is opened, and the specimen insertion rod 4 is inserted into the specimen chamber until its front end reaches a given position 11 indicated by the broken line. Thereafter, the electron beam is made to hit the specimen Under this condition, an electron microscope image is observed The field of view of the observed image is moved by operating a moving mechanism 12 which is attached to the rod 4 and located within the atmosphere. In order to observe the specimen after it has been cooled, it is necessary to circulate a refrigerant through a pipe (not shown) mounted inside the rod 4, for cooling the specimen holder 5. However, this pipe mounted in the insertion rod 4 supporting the specimen holder presents a problem. In particular, the refrigerant circulating through the pipe boils, producing vibration which is transmitted to the specimen This makes it difficult to observe the electron microscope image at high resolution.

Another conventional device is similar to the device described just above except that a stationary specimen stage is mounted inside the specimen chamber. Referring also to FIG. 5, the specimen holder 5 which is detachably held at the front end of the specimen insertion rod 4 is placed on the specimen stage. During the observation of the specimen, the rod 4 is placed outside the specimen chamber. The holder 5 is cooled via the stage.

With this device, no vibration is transmitted to the specimen stage. Therefore, it is relatively easy to cool the specimen holder while the specimen is being observed. However, this apparatus also suffers from a disadvantage. Specifically, after the cooled specimen is treated in a vacuum, the specimen is moved from the preliminary evacuation chamber onto the specimen stage. During this movement, the temperature of the holder shifts. In this way, it is difficult to maintain the specimen at a given temperature.

SUMMARY OF THE INVENTION

It is an object of the present invention to provide a device for replacing an electron microscope specimen while cooling or heating the specimen, for moving the specimen into the specimen chamber while maintaining the temperature of the specimen constant and which can continue cooling or heating the specimen without transmitting vibration to the specimen during the observation of the image of the specimen.

It is another object of the invention to provide a device for replacing an electron microscope specimen for treating the specimen in a vacuum and then replace the specimen while cooling or heating the specimen, for moving it into the specimen chamber while maintaining the temperature of the specimen constant and which can continue cooling or heating the specimen without transmitting vibration to the specimen during the observation of an image of the specimen.

It is a further object of the invention to provide a device for replacing an electron microscope specimen comprising a movable cylinder and a valve seat and which can replace the specimen while maintaining the requisite vacuum by bringing the cylinder into abutting engagement with the valve seat when the specimen is inserted.

It is yet another object of the invention to provide a device for replacing an electron microscope specimen having a stroke long enough to insert and treat the specimen, though the device is compact.

The above objects are achieved in accordance with the teachings of the invention by a device for use with an electron microscope having a specimen chamber in which a specimen stage is disposed, said device comprising: a preliminary chamber; a partition valve mechanism which partitions the preliminary chamber from the specimen chamber; a movable cylinder having a cover at its front end, the cylinder being capable of being moved from the preliminary chamber toward the specimen chamber; a rod-holding mechanism mounted in the cover for holding the specimen insertion rod; a hermetic seal mechanism which hermetically seals the specimen chamber by inserting the movable cylinder close to the partition valve mechanism; a terminal which extends through the cover while maintaining the airtightness of the specimen chamber, the terminal being insulated from the cover; and a flexible member which connects a specimen holder held at the front end of the specimen insertion rod with the terminal. The specimen holder can be moved from inside the atmosphere onto the specimen stage through the preliminary chamber for replacing the specimen holder with a new one.

A replacement is made by moving the specimen holder into the specimen chamber while keeping the specimen holder connected with a cooling means via the flexible member. Therefore, the specimen can be inserted into the specimen chamber while maintaining the specimen at a substantially constant temperature, for example, a low temperature. Then, the specimen can be observed without transmitting vibration to the specimen while retaining the temperature of the specimen constant.

THE DRAWINGS

Further features and other objects and advantages will become clear from the following detailed description made with reference to the drawings in which.

DETAILED DESCRIPTION OF THE INVENTION

Figure 1:
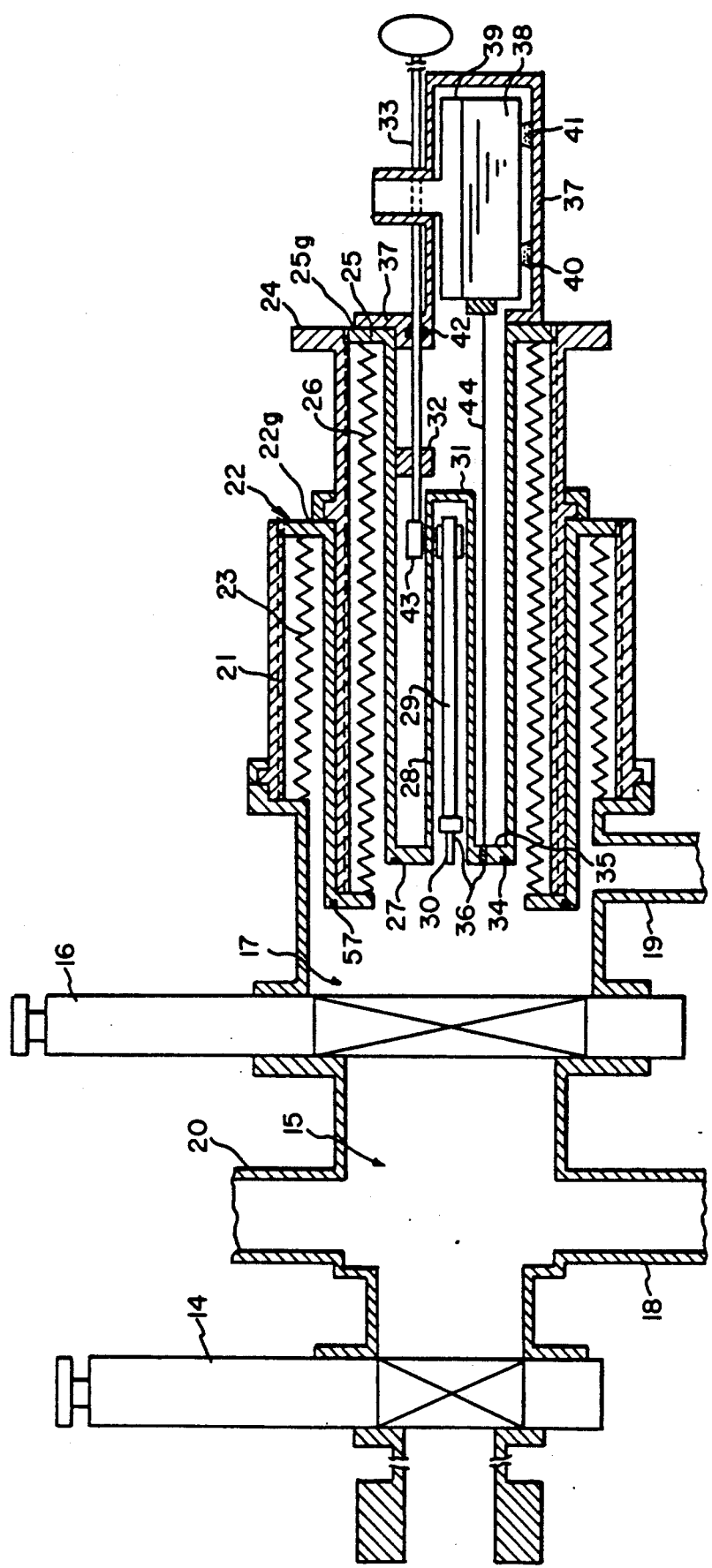
FIG. 1 is a cross-sectional view of main portions of a specimen-replacing device according to the invention.

Referring to FIG. 1, there is shown a specimen-replacing device according to the invention. This device has a first partition valve 14, a specimen treatment chamber 15, a second partition valve 16, and a preliminary evacuation chamber 17. The first partition valve 14 is mounted to the wall of the specimen chamber in an electron microscope. The specimen chamber accommodates a specimen stage. The specimen treatment chamber 15 and the preliminary evacuation chamber 17 are evacuated through evacuation tubes 18 and 19, respectively. The specimen treatment chamber 15 is provided with a port 20 through which an attachment (not shown) for treating the specimen is inserted. The attachment used is selected according to the purpose. The preliminary evacuation chamber 17 is hinged to the second partition valve 16. The inside of the evacuation chamber 17 can be placed in communication with the atmosphere.

The above device further includes a first translating cylinder 25, a second translating cylinder 22, a first cylindrical rotating member 24, and a second cylindrical rotating member 21. This second cylindrical rotating member 21 is rotatably mounted to the wall of the preliminary evacuation chamber 17 and has an internal thread where the movable cylinder 22 has a jaw 22g at its one end. This jaw 22g having an external thread is screwed to the internal thread of the cylindrical member 21. Since the jaw of the cylinder 22 is coupled to the wall of the evacuation chamber 17 -via bellows 23, the second cylinder 22 is prevented from rotating about its axis but allowed to be translated only along its axis. The first cylindrical rotating member 24 is mounted to the second cylinder 22 such that this member 24 can rotate while guided by the inner surface of the second cylinder 22. The first cylindrical member 24 has an internal thread. The first movable cylinder 25 has a jaw 25g to its one end. This jaw having an external thread is screwed to the internal thread of the first cylindrical member 24. The jaw of the first movable cylinder 25 is coupled to the end of the second cylinder 22 via bellows 26 and, therefore, the first cylinder 25 is prevented from rotating about its axis but permitted to be translated only along its axis.

A cover 27 is mounted over the front end of the first movable cylinder 25, or the end on the side of the specimen chamber, so as to close off the end. A central part of the cover 27 protrudes away from the specimen chamber to form a guide cylinder 28. A specimen insertion rod 29 is inserted in the guide cylinder 28 and held there. A specimen holder 30 is mounted to one end of the rod 29, while a magnet 31 is mounted to the other end.

An operation rod 33 is so mounted that it can move along the guide cylinder 28 while guided by a guide member 32. A magnet 43 is fixed to the front end of the operation rod 33. The specimen holder 30 can be magnetically moved together with the specimen insertion rod 29 by moving the operation rod 33. An annular groove is formed in the cover 27 remotely from its center. An 0 ring 34 is fitted in this groove. An enclosure 37 is mounted to the first movable cylinder 25 so as to be movable with it. A cooling vessel 39 holding liquid nitrogen 38 is mounted to the enclosure 37 and supported by heating insulating members 40 and 41. The inside of the first movably cylinder 25 and the space formed by the enclosure 37 are evacuated. An 0 ring 42 is fitted in the enclosure 37 to enable the rod 33 to be operated within the atmosphere while maintaining the vacuum. A terminal 35 which is located closer to the center of the cover 27 than the 0 ring 34 extends through the cover 27 and hermetically seals the cover 27. The side end of the terminal 35 that is on the side of the ultra high vacuum is connected with the specimen holder 30 via a flexible member 36 consisting of mesh of copper. The terminal 35 is connected with the cooling vessel 39 via a flexible member 44 consisting of mesh of copper.

In order to insert a new specimen into the specimen chamber from inside the atmosphere for observing the specimen, the preliminary evacuation chamber 17 is opened to place the inside in communication with the atmosphere. Then, the specimen is placed in the specimen holder 30 and attached to the front end of the specimen insertion rod 29. Subsequently, the inside of the evacuation chamber 17 is evacuated while hermetically sealing the chamber. At this time, the first and second partition valves 14 and 16, respectively, are closed. The inside of the specimen treatment chamber 15 is evacuated to a high vacuum via the evacuation pipe 18 by an evacuation system different from the evacuation system that evacuates the preliminary evacuation chamber 17.

Figure 2:
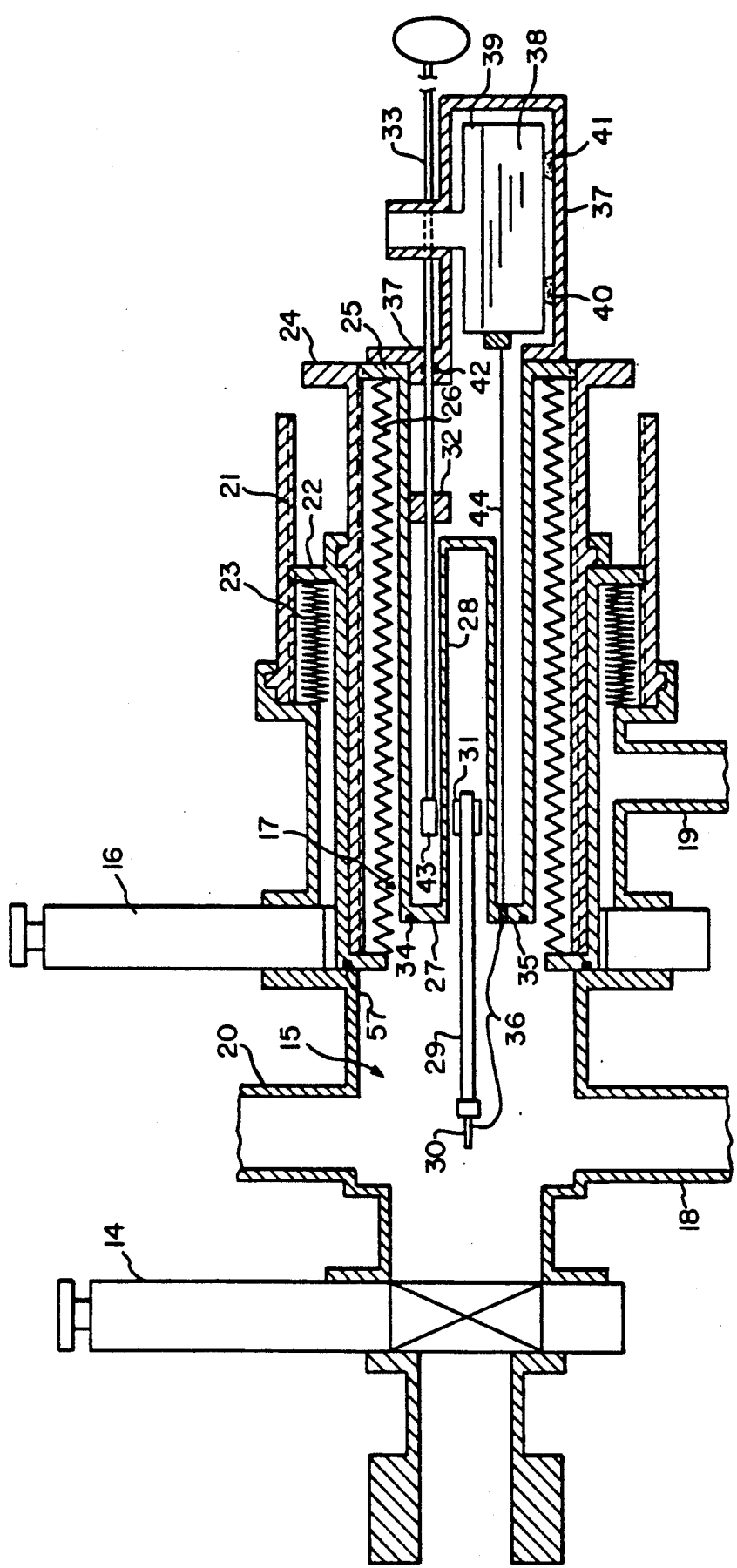
FIGS. 2 and 3 are view similar to FIG. 1 for showing different conditions.

Referring next to FIG. 2, the second partition valve 16 is then opened and the second cylindrical rotating member 21 is rotated to move the second cylinder 22 toward the specimen chamber. The 0 ring 37 at the front end of the second cylinder 22 is made to bear against the valve seat of the partition valve 16. As a result, the specimen holder 30 is transported into the specimen treatment chamber Then, the operation rod 33 is operated to move the specimen holder 30 into the position in which the specimen can be treated by the attachment inserted through the port 20. The attachment breaks the specimen or otherwise treats it. At this time, the holder 30 is connected with the cooling vessel 39 via the flexible member 36, the terminal 35, and the flexible member 44 and so the specimen can be maintained at a substantially constant low temperature during the treatment.

Figure 3:
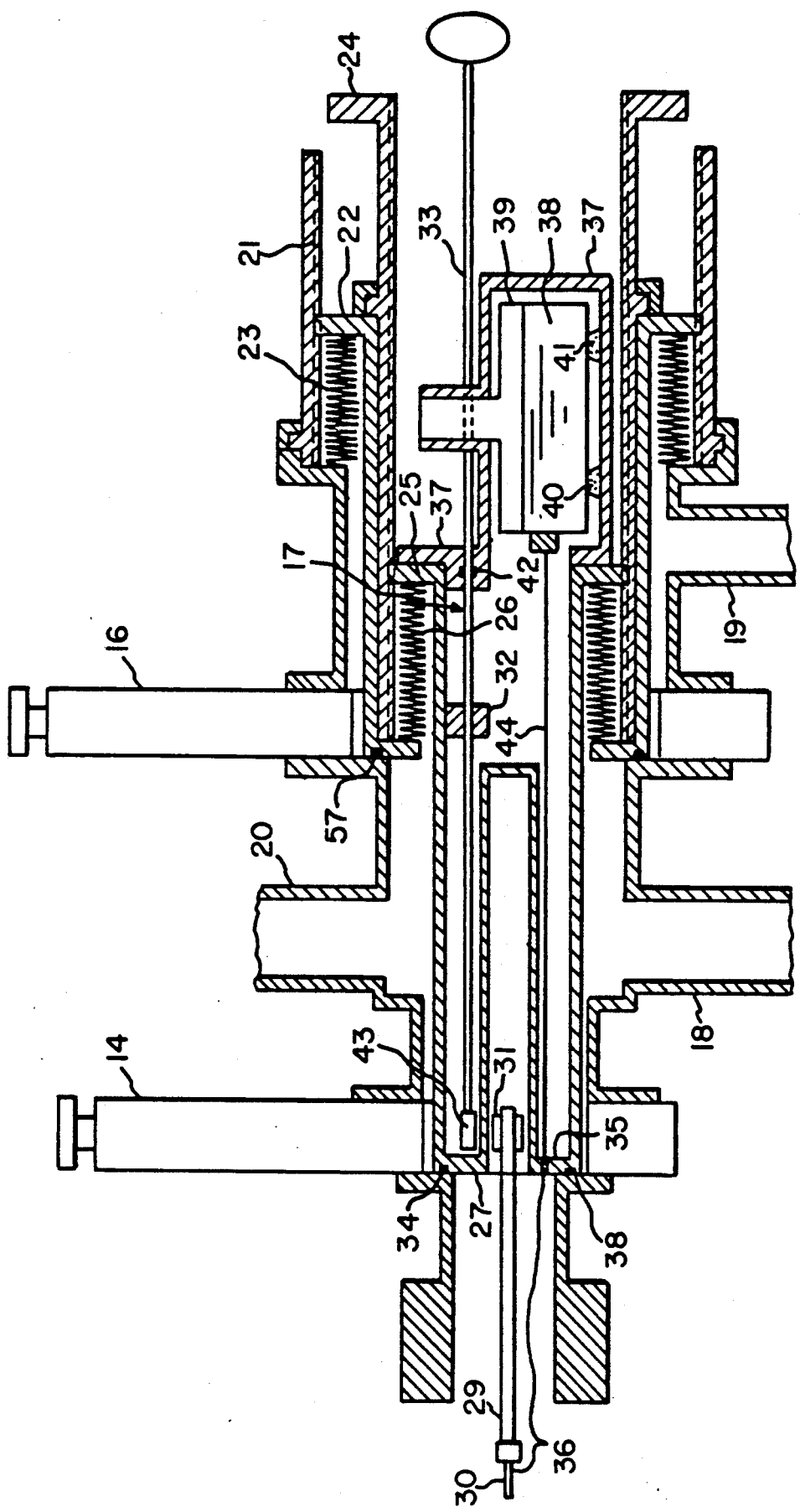
Figure 4:
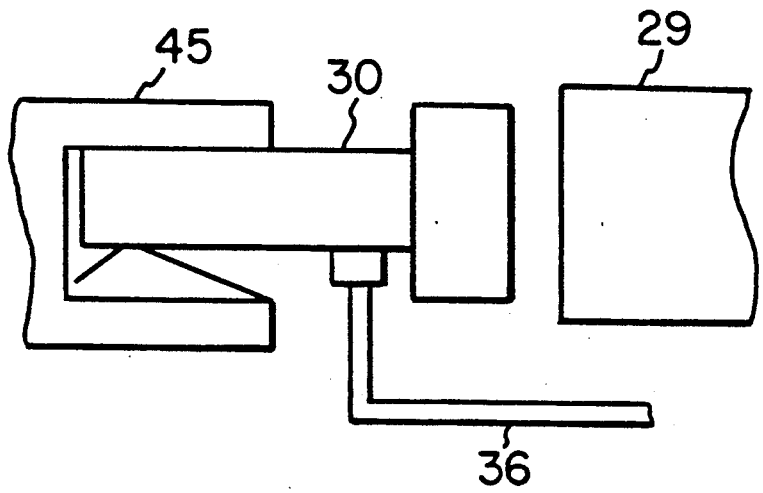
FIG. 4 is a cross-sectional view of the specimen holder shown in FIGS. 1-3 and in which a specimen holder is installed on the holder.
Figure 5:
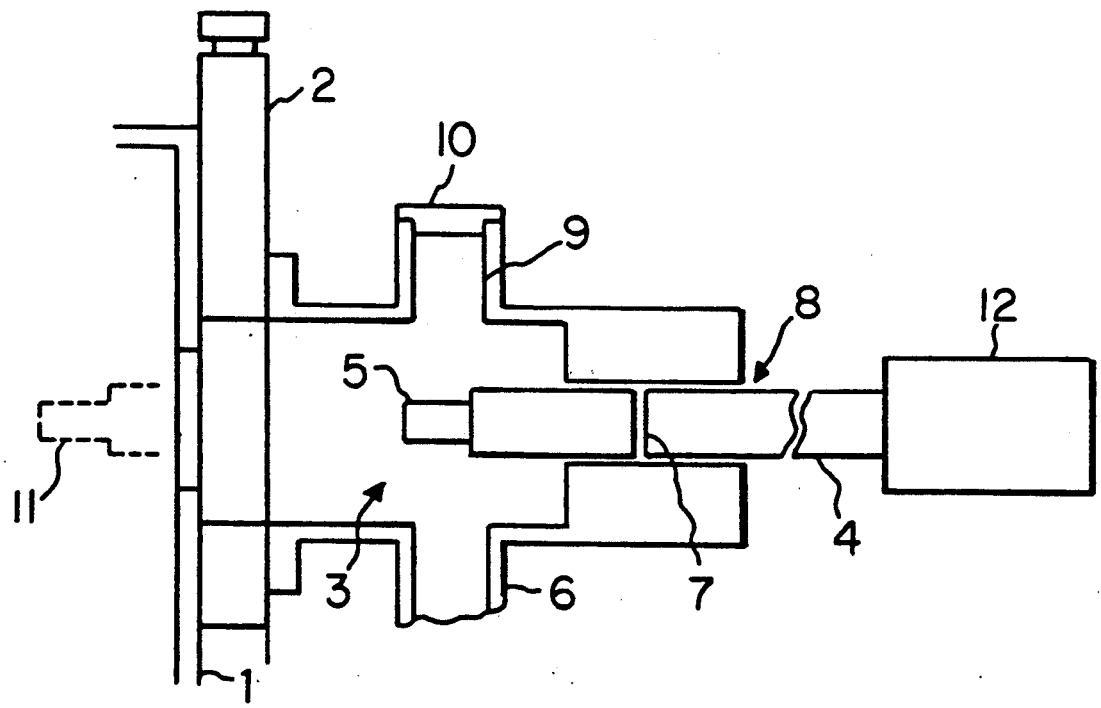
FIG. 5 is a cross-sectional view of a conventional specimen-replacing device.

After the treatment of the specimen, the first partition valve 14 is opened and the first cylindrical rotating member 24 is rotated to carry the first movable cylinder 25 toward the specimen chamber together with the cooling vessel 39, as shown in FIG. 3. Then, the 0 ring 34 fitted in the cover 27 of the first cylinder 25 is cause to abut against the valve seat 38 of the first partition valve 14. As a result, the specimen holder 30 is carried into the specimen chamber of the electron microscope. The operation rod 33 is operated to move the specimen insertion rod 29 toward the specimen stage so that the holder 30 may bear on the holder support of the stage. This condition is shown in FIG. 4. The holder 30 is held on the specimen stage 45 and separated from the specimen insertion rod 29. The holder 30 is connected via the flexible member 36 with the cooling vessel 39. Hence, it is easy to maintain the temperature of the specimen constant after it is treated. Since the holder 30 is connected via the terminal 35 with the cooling vessel 39 by means of the flexible member 36 that hardly transmits vibration, vibration caused by boiling of the refrigerant is not transmitted to the specimen, unlike in the prior art apparatus. Consequently, the specimen can be observed at high resolution as if the specimen was at room temperature.

It is to be understood that the invention is not restricted to the above example and that various changes and modifications may be made without departing from the spirity of the invention. In the above example, the specimen is cooled. The invention is also applicable to a device using a specimen holder incorporating a heater to heat the specimen. In this case, the flexible members 36 and 44 are replaced by electrical conductors, and the cooling vessel is replaced by a power supply.

In the above description, the preliminary evacuation chamber is formed independent of the specimen treatment chamber. The invention can also be applied to a specimen-replacing device having a preliminary chamber acting also as both preliminary evacuation chamber and specimen treatment chamber, the device being used with an electron microscope.

In the example described above, the cooling vessel makes use of liquid nitrogen. Instead, an electronic cooling device may be used.

In the example described above, the flexible members 36 and 44 are made of a thermal conductor. Each flexible member may be made of a pipe carrying a refrigerant to circulate it through the specimen holder.

In the example described above, both preliminary evacuation chamber and specimen treatment chamber are formed and so two cylindrical rotating members and two movable cylinders are provided. If the device has only the preliminary evacuation chamber of these two chamber, it is possible to form only one cylindrical rotating member and only one movable cylinder.

In the example described above, the cover is made to bear against the valve seat of one partition valve to maintain the vacuum in the specimen chamber. It is also possible to create a hermetic seal by bringing the outer surface of one movable cylinder into contact with the side surface of either the specimen chamber or the specimen treatment chamber when the cylinder is inserted close to the partition valve.

In the example described above, the cover is brought into abutting engagement with the valve seat of one partition valve. It is also possible to form a stop member independent of the valve seat close to the partition valve so that the cover may bear against the stop member. The aforementioned terminal may be installed in the wall of the guide cylinder 28 forming a part of the cover. If the hermetic seal on the cover is made from a heat proof member, then the portions surrounding the specimen holder can be baked. This is effective in enhancing the degree of vacuum when an evacuation is effected. The 0 ring that is a hermetic seal member and located on the cover may be placed on the side of the valve seat.

As can be understood from the description make thus far, the novel specimen-replacing device for use with an electron microscope is capable of moving a new specimen from inside the atmosphere into the specimen chamber and placing it on the specimen stage while maintaining the specimen at a constant temperature, such as a low temperature. After the specimen has been installed on the stage, the specimen can be observed while retaining the desired temperature without transmitting vibration to the specimen. Since the first movable cylinder is inserted into the second movable cylinder to increase the length of the stroke, a compact specimen-replacing device capable of sufficiently inserting the specimen can be offered. As the operation rod is moved, the specimen is magnetically carried together with the specimen insertion rod. Consequently, when a mechanical force is transmitted to the specimen-moving rod from inside the atmosphere, the specimen chamber can be completely hermetically sealed from the atmosphere.

Having thus described my invention with the detail and particularity required by the Patent Laws, what is claimed and desired to be protected by Letters Patent is set forth in the following claims.

What is claimed is:

1. A device for replacing an electron microscope specimen, said microscope having walls defining a specimen chamber in which a specimen stage is disposed, said device comprising:
   walls defining a preliminary chamber;
   a partition valve mechanism which seals the preliminary chamber from the specimen chamber;
   a movable cylinder positionable at least partially in the preliminary chamber having a cover at its front end, the cylinder being capable of being moved through the preliminary chamber toward the specimen chamber;
   a rod-holding mechanism mounted in the cover holding a specimen insertion rod;
   a seal mechanism which hermetically seals the specimen chamber by inserting the movable cylinder close to the partition valve mechanism;
   a terminal which extends through the cover and maintains the airtightness of the specimen chamber, the terminal being insulated from the cover; and
   a flexible member which connects a specimen holder held at the front end of the specimen insertion rod with the terminal;
   whereby the specimen holder can be moved from inside the atmosphere onto the specimen stage through the preliminary chamber, for replacing the specimen holder with a new specimen holder.

2. The device of claim 1, wherein said preliminary chamber is a preliminary evacuation chamber.

3. The device of claim 1, wherein said preliminary chamber is a specimen treatment chamber.

4. The device of claim 1, wherein said preliminary chamber is arranged to function as a preliminary evacuation chamber and also as a specimen treatment chamber.

5. The device of claim 1, wherein said hermetic seal mechanism includes a stop member against which the cover bears and an annular seal member that maintains the airtightness of the specimen chamber when the cover bears against the stop member located close to the partition valve mechanism.

6. The device of claim 5, wherein said stop member is a valve seat included in said partition valve mechanism.

7. The device of claim wherein said terminal is thermally insulated from the cover, and wherein said flexible member is made of a good thermal conductor and connected with a cooling means via said terminal and also via a highly thermal conducting member.

8. The device of claim 7, wherein the inside of said movable cylinder is evacuated, and wherein said thermally highly conducting member is connected with said cooling means through the evacuated space in the cylinder.

9. The device of claim 1, wherein said specimen holder has a heater for heating the specimen, and wherein said flexible member is a wire for supplying electrical current to the heater.

10. The device of claim 1, wherein said rod-holding mechanism in the cover includes a guide cylinder formed by extending a part of the cover toward the atmosphere, and wherein said specimen insertion rod is inserted and movably held in the guide cylinder.

11. The device of claim 10, further including: an operation rod disposed outside the guide cylinder and capable of moving along the guide cylinder; and a magnet producing a magnetic force which transmits movement of the operation rod to the specimen insertion rod in the guide cylinder, for moving the rod.

12. A device for use with an electron microscope having a specimen chamber in which a specimen stage is disposed, said device comprising:
    walls defining a preliminary evacuation chamber;
    walls defining a specimen treatment chamber;
    a first partition valve mechanism which seals the preliminary evacuation chamber from the specimen treatment chamber;
    a second partition valve mechanism which seals the specimen treatment chamber from the specimen chamber;
    a first movable cylinder mounted in such a way that it can be inserted into the preliminary evacuation chamber;
    a second movable cylinder mounted in such a way that it can be inserted into the specimen treatment chamber while guided by the first movable cylinder;
    a cover formed so as to close off the front end of the second cylinder;
    a rod-holding mechanism mounted in the cover for holding a specimen insertion rod;
    a first hermetic seal portion which, when the front end of the first cylinder bears against a first valve seat included in the first partition valve mechanism, maintains the specimen treatment chamber airtight;
    a second hermetic seat portion which, when the cover bears against a second valve seat included in the second partition valve mechanism, maintains the specimen chamber airtight;
    a terminal which extends through the cover and hermetically seals it, the terminal being insulated from the cover;
    a flexible member connecting a specimen holder held at the front end of the specimen insertion rod with the terminal;
    whereby the specimen holder can be moved from inside the atmosphere onto the specimen stage through both preliminary evacuation chamber and specimen treatment chamber, for replacing the specimen holder.

* * * * *

UNITED STATES PATENT AND TRADEMARK OFFICE
CERTIFICATE OF CORRECTION

PATENT NO. : 5,039,864

DATED : August 13, 1991

INVENTOR(S) : Yukihito Kondo

It is certified that error appears in the above-identified patent and that said Letters Patent is hereby corrected as shown below:

ON THE TITLE PAGE:

Item [73] after Assignee: "Jeol Ltd." should read --JEOL Ltd.--.

Column 1 Line 20 after "chamber" insert --3,--.

Column 1 Line 43 "lo" should read --10--.

Column 1 Line 44 after "9" insert --,--.

Column 1 Lines 51-52 after "specimen" insert --,--.

Column 1 Line 53 after "observed" insert --,--.

Column 1 Line 63 after "specimen" insert --,--.

Column 3 Line 58 "-via" should read --via--.

Column 3 Line 65 "to" should read --at--.

UNITED STATES PATENT AND TRADEMARK OFFICE
CERTIFICATE OF CORRECTION

PATENT NO. : 5,039,864

DATED : August 13, 1991

INVENTOR(S) : Yukihito Kondo

It is certified that error appears in the above-identified patent and that said Letters Patent is hereby corrected as shown below:

Column 4 Line 26 "movably" should read --movable--.

Column 4 Line 61 after "chamber" insert --,--.

Column 5 Line 8 "cause" should read --caused--.

Column 5 Line 56 "chamber" should read --chambers--.

Column 6 Line 12 "make" should read --made--.

Claim 7 Line 15 Column 7 after "claim" insert --1,--.

Claim 12 Line 27 Column 8 "seat" should read --seal--.

Signed and Sealed this

Tenth Day of November, 1992

Attest:

DOUGLAS B. COMER

Attesting Officer

Acting Commissioner of Patents and Trademarks